(12) United States Patent
Sato et al.

(10) Patent No.: US 7,556,687 B2
(45) Date of Patent: *Jul. 7, 2009

(54) GALLIUM NITRIDE CRYSTAL SUBSTRATE AND METHOD OF PRODUCING SAME

(75) Inventors: Fumitaka Sato, Hyogo (JP); Seiji Nakahata, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 260 days.

This patent is subject to a terminal disclaimer.

(21) Appl. No.: 11/602,948

(22) Filed: Nov. 22, 2006

(65) Prior Publication Data

US 2007/0062440 A1 Mar. 22, 2007

Related U.S. Application Data

(63) Continuation-in-part of application No. 10/933,291, filed on Sep. 3, 2004, now Pat. No. 7,303,630, and a continuation-in-part of application No. 10/936,512, filed on Sep. 9, 2004, now Pat. No. 7,354,477.

(30) Foreign Application Priority Data

Feb. 17, 2006 (JP) ............................. 2006-041140

(51) Int. Cl.
*C30B 29/38* (2006.01)
(52) U.S. Cl. ..................... 117/94; 117/95; 117/104; 257/104
(58) Field of Classification Search .................. 117/94, 117/95, 104; 257/104
See application file for complete search history.

(56) References Cited

U.S. PATENT DOCUMENTS 6,252,261 B1 6/2001 Usui et al.

(Continued)

FOREIGN PATENT DOCUMENTS

EP 1 088 914 A1 4/2001

(Continued)

OTHER PUBLICATIONS

European Search Report issued in European Patent Application No. EP 02 02 1243, dated Apr. 2, 2008.

(Continued)

*Primary Examiner*—Robert M Kunemund
(74) *Attorney, Agent, or Firm*—McDermott Will & Emery LLP

(57) ABSTRACT

A low-distortion gallium nitride crystal substrate including low dislocation single crystal regions (Z) having a definite c-axis and a definite a-axis, C-plane growth regions (Y) having a c-axis and a-axis parallel to the c-axis and a-axis of the low dislocation single crystal regions (Z), voluminous defect accumulating regions (H) having a c-axis inverse to the c-axis of the low dislocation single crystal regions (Z) and an a-axis parallel with the a-axis of the low dislocation single crystal regions (Z), and $0.1/cm^2$ to $10/cm^2$ c-axis gross core regions (F) containing at least one crystal having a c-axis parallel to the c-axis of the low dislocation single crystal regions (Z) and an a-axis different from the a-axis of the low dislocation single crystal regions (Z).

6 Claims, 5 Drawing Sheets

U.S. PATENT DOCUMENTS 6,667,184 B2 * 12/2003 Motoki et al. ................. 438/22
7,112,826 B2 * 9/2006 Motoki et al. ............... 257/103
7,303,630 B2 * 12/2007 Motoki et al. ................ 117/94
7,354,477 B2 * 4/2008 Motoki et al. ................ 117/94

FOREIGN PATENT DOCUMENTS

| JP | 2003-165799 | 6/2003 |
|---|---|---|
| JP | 2003-183100 | 7/2003 |

OTHER PUBLICATIONS

Hiramatsu, K., et al. "Fabrication and characterization of low defect density GaN using facet-controlled epitaxial lateral overgrowth (FACELO)," Journal of Crystal Growth, 2000, p. 316-326, vol. 221, Elsevier Science B.V.

* cited by examiner

Pattern A

Pattern B

Pattern C、E

Pattern D、F

R=Z+Y

R=Z+Y

GALLIUM NITRIDE CRYSTAL SUBSTRATE AND METHOD OF PRODUCING SAME

RELATED APPLICATIONS

This application is a continuation-in-part application of U.S. patent application Ser. No. 10/933,291 filed on Sep. 3, 2004 now U.S. Pat. No. 7,303,630 and Ser. No. 10/936,512 filed on Sep. 9, 2004 now U S. Pat No. 7,354,477.

BRIEF DESCRIPTION OF THE INVENTION

This invention relates to a low-distortion gallium nitride (GaN) crystal substrate with small distortion and a method of producing a low-distortion gallium nitride substrate. Low-distortion gallium nitride wafers of the present invention can be widely utilized as substrate wafers for making light emitting diodes (LEDs), laser diodes (LDs) and other semiconductor devices.

BACKGROUND OF THE INVENTION

Gallium nitride crystal substrates are widely used as substrates of a variety of semiconductor devices. Improvement of properties of semiconductor devices requires low dislocation density GaN wafers.

(1) Japanese Patent Laying Open No. 2003-165799 and (2) Japanese Patent Laying Open No. 2003-183100 newly proposed facet-growth methods for making low-dislocation density GaN crystal wafers. These are named a facet-growth method by the Inventors. The facet growth method reduces dislocations by making masks on an undersubstrate, growing gallium nitride on the masked undersubstrate, building facets at predetermined spots, combining dislocations of different signs at the facets and annihilating dislocations.

The above facet growth method can decrease dislocations and can make low-dislocation GaN substrate wafers. Bottom parts, which had been nearer to the undersubstrate, have higher dislocation densities. Top parts, which had been farther distanced from the undersubstrate, have lower dislocation densities. There is a gradient of dislocation density in the direction of thickness in the face-growth-method-made GaN wafers. The dislocation density gradient in the vertical direction induces large distortion in GaN wafers, which is equivalent to a small curvature radius. Large distortion prevents the GaN wafers from growing uniform epitaxial layers thereon. Ununiformity of epitaxial layers prohibits the GaN wafers from making semiconductor devices having uniform properties.

A purpose of the present invention is to provide a low-distortion gallium nitride substrate and a method of producing a low-distortion gallium nitride substrate. Low distortion means small bending of a surface. Low or small distortion is equivalent to a long or wide curvature radius, since a curvature radius is a reciprocal of a curvature.

SUMMARY OF THE INVENTION

The present invention provides a gallium nitride (GaN) substrate consisting of matrix crystal regions (R), voluminous defect accumulating regions (H), c-axis gross core regions (F) and random defect bundle regions (G). A density Df of the c-axis gross core regions (F) is $0.1/cm^2$ to $10/cm^2$ in the GaN substrate. Another density Dg of the random defect bundle regions (G) is less than $100/cm^2$. $0.1/cm^2 \leq Df \leq 10/cm^2$. $Dg \leq 100/cm^2$.

The voluminous defect accumulating regions (H) are grown on masked parts of an undersubstrate. The voluminous defect accumulating regions (H) contain assembled sets of dislocations. The matrix crystal regions (R) are formed on exposed portions of the undersubstrate. The matrix crystal regions (R) are good single crystals of low dislocation density. The c-axis of the matrix crystal regions (R) is parallel to an upward normal standing on a surface of the undersubstrate. A matrix crystal region (R) consists of two parts. One is a low dislocation single crystal region (Z), which has been produced at a mask-neighboring part on an exposed part and been formed by facet growth. The other is a C-plane growth region (Y), which has been produced at a mask-distanced part on an exposed part and been formed by C-plane (0001) growth. Both the low dislocation single crystal regions (Z) and C-plane growth regions (Y) are low-dislocation single crystals of good quality produced on exposed parts. The low dislocation single crystal regions (Z) are sometimes called accompanying low dislocation single crystal regions (Z). Namely, low dislocation single crystal regions (Z)=accompanying low dislocation single crystal regions (Z). The C-plane growth regions (Y), which experience C-plane growth, are sometimes called extra low dislocation single crystal regions (Y). Namely, C-plane growth regions (Y)=extra low dislocation single crystal regions (Y). A matrix crystal region (R) is the sum of a low dislocation single crystal region (Z) and a C-plane growth region (Y). Namely, R=Z+Y. Thus the expression of low dislocation single crystal regions (Z) and C-plane growth regions (Y) is equivalent to the matrix crystal region (R), since Z+Y=R. The low dislocation single crystal regions (Z) and C-plane growth regions (Y) have a common definite c-axis parallel to the normal of the undersubstrate. The voluminous defect accumulating regions (H) have a c-axis reverse to the c-axis of the low dislocation single crystal regions (Z) and C-plane growth regions (Y). The c-axis of the voluminous defect accumulating regions (H) is antiparallel to the c-axis of the low dislocation single crystal regions (Z) and C-plane growth regions (Y). The c-axis gross core regions (F) are formed on masked parts. The c-axis of the c-axis gross core regions (F) is equal to the c-axis of the low dislocation single crystal regions (Z) and C-plane growth regions (Y). The c-axis gross core regions (F) are yielded within the voluminous defect accumulating regions (H) on masked parts. Both regions (H) and (F) stand upon masked parts. But (F)'s c-axis is antiparallel to (H)'s c-axis. Namely, (Z)'s, (F)'s and (Y)'s c-axes are parallel. (Z)'s, (F)'s and (Y)'s c-axes are a definite one c-axis. (H)'s c-axis is antiparallel to (Z)'s, (F)'s and (Y)'s c-axis. when a (0001) surface is upside laid, (Z), (Y) (or (R)) and (F) have upward c-axes and (H) has a downward c-axis. The a-axes of the c-axis gross core regions (F) are different from the a-axis of the matrix crystal regions (R), namely, low dislocation single crystal regions (Z) and C-plane growth regions (Y). The random defect bundle regions (G), which are assemblies of dislocations, are formed on exposed parts of the undersubstrate. Orientations are random in the random defect bundle regions (G). (Z), (Y) and (G) are formed on exposed parts. (H) and (F) are formed on masked parts.

In brief, the GaN substrate of the present invention can be expressed by $$GaN = Z+Y+H+F+G, R=Z+Y,$$

$$0.1/cm^2 \leq Df \leq 10/cm^2 \text{(density of } F\text{)},$$

$$0/cm^2 \leq Dg \leq 100/cm^2 \text{(density of } G\text{)},$$

Z, Y, (R) and F . . . upward c-axes, H . . . downward c-axis, G . . . random c-axis, Z, Y, (R) and G . . . on exposed parts, H and F . . . on masked parts.

The present invention proposes a method of producing a gallium nitride substrate including the steps of forming mask films having openings on an undersubstrate, growing a gallium nitride crystal, making more than one core seed at least on a part of masked parts, forming voluminous defect accumulating regions (H) on masked parts, growing low dislocation single crystal regions (Z) and C-plane growth regions (Y) on exposed parts, growing c-axis gross core regions (F) from the core seeds on the masked parts, growing the gallium nitride crystal and slicing the gallium nitride crystal into at least a gallium nitride wafer.

The present invention further proposes another method of producing GaN wafers by making use of a GaN wafer made by the present invention as an undersubstrate.

The present invention further proposes a method of making a GaN substrate wafer by an HVPE method which maintains more than 2.5 kPa Ga-material gas partial pressure and more than 30 kPa N-material gas partial pressure at least for early three minutes from the beginning of growth ($P_{Ga}$>2.5 kPa, $P_N$>30 kPa).

The condition ($P_{Ga}$>2.5 kPa, $P_N$>30 kPa) of more than 2.5 kPa Ga-material gas partial pressure and more than 30 kPa N-material gas partial pressure is an oversaturation condition. The present invention newly adopts the oversaturation condition for making c-axis gross core regions (F) and random defect bundle regions (G). An unsaturation condition is denoted by $P_{Ga}$<2.5 kPa, $P_N$<30 kPa. Conventional GaN growth methods have been relied exclusively upon the unsaturated condition.

[Advantage of the Invention]

This invention proposes a low-distortion GaN substrate and a method of producing a low-distortion GaN substrate.

[Preferable Version 1]

A GaN substrate 1 of Preferable Version 1 of the present invention includes a matrix crystal regions (R) 11(=low dislocation single crystal regions (Z) and C-plane growth regions (Y): R=Z+Y), voluminous defect accumulating regions (H) 21, c-axis gross core regions (F) 31 and random defect bundle regions (G) 12, which is denoted by FIG. 1(b). The voluminous defect accumulating regions (H) have c-axes inverse to the c-axis of the matrix crystal regions (R) and a-axes similar to the a-axis of the matrix crystal regions (R=Z+Y). The c-axis gross core regions (F) 31, each of which includes at least one crystal, have a-axes different from the a-axis of the matrix crystal regions (R=Z+Y) and a c-axis parallel to the c-axis of the matrix crystal regions (R=Z+Y). $0.1/cm^2$ to $10/cm^2$ c-axis gross core regions (F) are included in the GaN substrate.

The GaN substrate of the present invention includes c-axis gross core regions (F), one of which contains more than one crystal having an a-axis different from, and a c-axis common with the low dislocation single crystal regions (Z) and C-plane growth regions (Y). Dislocations newly happen at interfaces between the c-axis gross core regions (F) and low dislocation single crystal regions (Z). New production of dislocations decreases the bending (distortion) of a GaN wafer. Low distortion GaN wafers can be obtained.

FIG. 7(a) and FIG. 7(b) show the facet growth method proposed by (1) Japanese Patent Laying Open No. 2003-165799 and (2) Japanese Patent Laying Open No. 2003-183100 for decreasing dislocations. The facet growth method reduces dislocations by forming masks 20 with openings on an undersubstrate 10, growing a gallium nitride crystal, forming facets 11f in addition to C-planes 11c, which is a principal plane, converging dislocations into voluminous defect accumulating regions (H) 21 formed at facet pit bottoms on the masks 20 by the function of the facets, combining plus sign dislocations with minus sign dislocations in the voluminous defect accumulating regions (H), and extinguishing dislocations in the low dislocation single crystal regions (Z) and C-plane growth regions (Y).

In the facet growth method proposed by the Prior Patent Documents (1) and (2), dislocations are reduced by combination of different sign dislocations in the voluminous defect accumulating regions (H) during the growth. A reducing dislocation density gradient occurs in the vertical direction. The progress of growth increases the difference of dislocation density between a near-top plane 11t and a near-bottom plane 11s. A big difference of dislocation density causes strong distortion to the GaN substrate wafer sliced from the facet-growth GaN crystal. FIG. 7(b) is a section of a GaN wafer 1 obtained by slicing the Fig. (a) crystal in planes 11t and 11s. The GaN wafer has large distortion, which is equivalent to a small curvature radius, due to the decreasing dislocation gradient.

On the contrary, the present invention makes a gallium nitride crystal having c-axis gross core regions (F) 31 and produces new dislocations at interfaces between the c-axis gross core regions (F) 31 and low dislocation single crystal regions (Z) 11. New production of dislocations by the c-axis gross core regions (F) 31 suppresses the vertical reduction of dislocations. The dislocation difference between the near-top plane 11t and the near-bottom plane 11s is decreased by the new generation of dislocations made by the c-axis gross core regions (F) 31. Uniform dislocation density distribution has a function of reducing the distortion of the GaN wafer obtained from the grown GaN crystal by cutting in planes 11t and 11s.

One of the c-axis gross core regions (F) 31 contains at least one crystal. New dislocations are produced between the c-axis gross core regions (F) and the low dislocation single crystal regions (Z) and between neighboring c-axis gross core regions (F) on the masks 20.

A GaN crystal has a hexagonal system. A hexagonal system has a set of crystallographical axes consisting of a c-axis and a-/b-/d-axes which are vertical to the c-axis. The a-/b-/d-axes meet with each other at 120 degrees. The a-axis, b-axis and d-axis entirely are geometrically equivalent. Thus a-axes of the low dislocation single crystal regions (Z), C-plane growth regions (Y), c-axis gross core regions (F), voluminous defect accumulating regions (H) and random defect bundle regions (G) are chosen as the ones, which have the nearest directions among the regions. Thus the maximum of differences of a-axes is 60 degrees.

The a-axes of the voluminous defect accumulating regions (H) 21 are similar to the a-axis of the low dislocation single crystal regions (Z) and C-plane growth regions (Y) 11. This means that an a-axis of at least one crystal included in the voluminous defect accumulating regions (H) 21 is substantially equal to the definite a-axis of the low dislocation single crystal regions (Z) and C-plane growth regions (Y) II within an allowable deviation angle of 30 degrees. The deviation angle is defined as a difference between corresponding axes, for example, a-axis/a-axis, c-axis/c-axis of different regions (H), (F), (Z), (Y) and (G). The deviation angles can be measured on an electron back scattering pattern (EPSP) obtained by a scanning electron microscope (SEM).

The c-axes of the voluminous defect accumulating regions (H) 21 are inverse to the c-axis of the low dislocation single crystal regions (Z) and C-plane growth region (Y) 11. This defines the voluminous defect accumulating regions (H) 21.

This means that at least one crystal included in the voluminous defect accumulating regions (H) 21 has a c-axis vector which is substantially inverse to the definite c-axis vector of the low dislocation single crystal regions (Z) and C-plane growth regions (Y) 11. Here the word "substantially inverse" means that two vectors of c-axes of (H) and (Z,Y) are inverse and the discrepancy between the (Z,Y)'s c-axis and an inverse of the (H) c-axis is less than 30 degrees.

The a-axes of the c-axis gross core regions (F) 31 are different from the a-axis of the low dislocation single crystal regions (Z) and C-plane growth regions (Y) 11. This means that the a-axis vector of at least one crystal included in c-axis gross core regions (F) is substantially different from the definite a-axis vector of the low dislocation single crystal regions (Z) and C-plane growth regions (Y) 11. The (F)'s a-axes vectors are directed at random. Discrepancy angles between the (F)'s a-axes and the (Z,Y)'s a-axis are less than 60 degrees.

The c-axes of the c-axis gross core regions (F) 31 are similar to the c-axis of the low dislocation single crystal regions (Z) and C-plane growth regions (Y) 11. The coincidence of c-axes is the reason why this region (F) is named as a "c-axis gross core region (F)". This means that the c-axis vectors of the c-axis gross core regions (F) 31 are substantially equal to the definite c-axis vector of the low dislocation single crystal regions (Z) and C-plane growth regions (Y) 11 within a small discrepancy less than 30 degrees.

The GaN substrates of the present invention contain more than $0.1/cm^2$ but less than $10/cm^2$ of c-axis gross core regions (F) 31. Lower than $0.1/cm^2$ of c-axis gross core regions (F) would enlarge GaN wafer distortion (or equivalent to decreasing curvature radii). Higher than $10/cm^2$ of c-axis gross core regions (F) 31 would enlarge GaN wafer distortion (or equivalent to decreasing curvature radii). Both cases would not be suitable for substrates to make semiconductor devices.

The GaN crystal substrate of the present invention has quasi-uniformly distributing c-axis gross core regions (F) 31. The c-axis gross core regions (F) 31 have individual a-axes randomly fluctuating at angles between 0 degree and 60 degrees to the definite a-axis of the low dislocation single crystal regions (Z) and C-plane growth regions (Y) 11. When a c-axis gross core region (F) includes a plurality of crystals, the crystals have individual a-axes randomly fluctuating at angles between 0 degree and 60 degrees to the definite a-axis of the low dislocation single crystal regions (Z) and C-plane growth regions (Y) 11. Dislocations are distributed uniformly on the GaN crystal substrates of the present invention. The distortion of the GaN wafers is small due to the uniform distribution of dislocations.

Sizes of the c-axis gross core regions (F) 31 are not restricted. Most of the appearing c-axis gross core regions (F) 31 have diameters of less than 1 mm (d<1 mm; under 1 mm diameter). Sometimes large c-axis gross core regions (F) 31 with diameters larger than 1 mm (d>1 mm) happen to appear. But the diameters of the c-axis gross core regions (F) 31 are less than 2 mm. Thus c-axis gross core regions (F) 31 can be classified into two groups of 0<d<1 mm and 1 mm<d<2 mm by diameters d.

It is preferable for the GaN substrate wafers of the present invention to include less than $100/cm^2$ of random defect bundle regions (G) 12 in the low dislocation single crystal regions (Z) and C-plane growth regions (Y). Inclusion of the random defect bundle regions (G) maintains dislocations and suppresses occurrence of distortion of wafers. An adequate density of random defect bundle regions (G) 12 favors suppression of distortion. When the random defect bundle region (G) density exceeds $100/cm^2$, dislocation density would be heighten. High-dislocation density GaN wafers are unsuitable for substrate wafers to make semiconductor devices thereupon.

Sizes of the random defect bundle regions (G) 12 are not restricted. Most of the appearing random defect bundle regions (G) have diameters of less than 500 μm=0.5 mm (d<0.5 mm; under 0.5 mm diameter).

A fluorescence microscope enables the Inventors to observe low dislocation single crystal regions (Z), C-plane growth region (Y), voluminous defect accumulating regions (H), c-axis gross core regions (F) and random defect bundle regions (G) in GaN substrates produced by the teaching of the present invention. The fluorescence microscope observation allows us to calculate a density of c-axis gross core regions (F) and another density of random defect bundle regions (G). Crystallographical axes and orientations of the different regions (Z), (Y), (H), (F) and (G) are determined by an X-ray diffraction method (XRD). A focused electron diffraction method enables us to discern voluminous defect accumulating regions (H) from low dislocation single crystal regions (Z) and C-plane growth regions (Y) by differences of polarities. Wet-etching allows the Inventors to discriminated voluminous defect accumulating regions (H) from low dislocation single crystal regions (Z) and C-plane growth regions (Y) by differences of etching speeds.

[Preferable Version 2 (Method)]

A preferable version of a method of making a gallium nitride crystal substrate comprises the steps of forming masks 20 with openings on an undersubstrate 10, growing gallium nitride on the masked undersubstrate, forming at least a core seed at least on parts of masked parts, growing low dislocation single crystal regions (Z) and C-plane growth regions (Y) 11 on exposed parts, forming voluminous defect accumulating regions (H) 21 on the masked parts 20 and growing c-axis gross core regions (F) 31 from the core seeds on the masked parts 20.

The masks should be made from materials having functions of suppressing GaN from growing thereupon and of forming core seeds having an a-axis different from an a-axis of low dislocation single crystal regions (Z) and C-plane growth regions (Y). Preferable materials for the masks are amorphous or polycrystalline $SiO_2$, amorphous or polycrystalline $Si_3N_4$ and the like. The mask layers are formed on a top surface of an undersubstrate 10 by sputtering or CVD (chemical vapor deposition).

The present invention does not restrict the material of undersubstrates. The undersubstrate material should enable gallium nitride to grow epitaxially thereon. For example, sapphire single crystals, GaAs single crystals, and SiC single crystals are preferable as undersubstrates. Complex substrates which have been made by depositing a thin epitaxial GaN layer on a sapphire substrate or a GaAs substrate by e.g., an MOCVD method are also available for undersubstrates for purposes of reducing dislocation density of low dislocation single crystal regions (Z) and C-plane growth regions (Y).

The method of growing GaN crystals is not restricted. Preferable growing methods are an HVPE (hydride vapor phase epitaxy) and an MOCVD (metallorganic chemical vapor deposition). The method should grow GaN crystals epitaxially. The HVPE method grows a gallium nitride crystal by supplying GaCl gas as a Ga-material and $NH_3$ gas as an N-material gas. The MOCVD method grows a gallium nitride crystal by supplying TMG (trimethylgallium) gas or TEG (triethylgallium) gas as a Ga-material and $NH_3$ gas as an N-material gas. The HVPE has an advantage of high speed growth. The HVPE method, which requires higher gas pressures of Ga- and N-materials than the MOCVD method, needs to make a larger size of mask patterns than the MOCVD for facilitating the formation of the c-axis gross core regions (F) on the masks.

A gallium nitride crystal substrate producing method of an embodiment of the present invention is clarified by referring to FIG. 1(a). A method of making a gallium nitride substrate includes the steps of forming masks 20 with openings on an undersubstrate 10, making more than a core seed 30 at least partially on a mask layer 20, forming low dislocation single crystal regions (Z) and C-plane growth regions (Y) 11 on exposed parts, growing voluminous defect accumulating regions (H) 21 on the masked parts of the undersubstrate 10 and growing c-axis gross core regions (F) 31 from the core seeds 30.

The formation of core seeds 30 on the mask layers 20 requires to supply material gases (HCl and $NH_3$ gases) at least at an early stage of growth on an oversaturated condition of synthesized gallium nitride gas.

The low dislocation single crystal regions (Z) and C-plane growth regions (Y) are formed upon exposed parts of the undersubstrate 10. Core seeds 30 and voluminous defect accumulating regions (H) are formed on the masked parts. If the core seeds 30 were buried by laterally-propagating voluminous defect accumulating regions (H), no c-axis gross core regions (F) 31 would happen. Making c-axis gross core regions (F) 31 on the core seeds definitely requires a new contrivance. A c-axis core region (F) 31 growing speed $V_F$ is faster than a core seed growing speed $V_S$. The c-axis core region (F) 31 growing speed $V_F$ is faster than a voluminous defect accumulating regions (H) growing speed $V_H$. Namely, $V_F > V_S$ and $V_F > V_H$. At least early three minutes of supply of the Ga- and N-material gases on the GaN oversaturation condition make sufficiently large core seeds (for example, core seeds of diameters more than 0.2 μm) on the masked parts. Once large core seeds have been born on the masked parts, voluminous defect accumulating regions (H) 21 on the masked parts 20 cannot bury the core seeds due to the slower growing speed $V_H$. Thus large c-axis gross core regions (F) 31 can be built and established on the masked parts. The longer time the oversaturation is maintained, the larger the size of the c-axis gross core regions (F) 31 become. The oversaturation gas supply is very important for building strong c-axis gross core regions (F) 31.

When the HVPE method grows a GaN crystal, the formation of c-axis gross core regions (F) on masked parts requires to supply sufficient material gases and maintain more than 2.5 kPa GaCl gas partial pressure and more than 30 kPa $NH_3$ gas partial pressure ($P_{GaCl} > 2.5$ kPa, $P_{NH3} > 30$ kPa) for at least three minutes at an early stage from the beginning of the growth. When the MOCVD method grows a GaN crystal, the formation of c-axis gross core regions (F) on masked parts requires to maintain more than 2.5 kPa TMG or TEG gas partial pressure and more than 30 kPa $NH_3$ gas partial pressure ($P_{TMG}$ or $P_{TEG} > 2.5$ kPa, $P_{NH3} > 30$ kPa) for at least three minutes at an early stage from the beginning of the growth.

Supply of high partial pressures of Ga- and N-material gases makes and keeps GaN gas oversaturation atmosphere. The oversaturated GaN atmosphere enables the material gases to make matrix crystal regions (R) (R=Z+Y) on the exposed parts, and voluminous defect accumulating regions (H) and c-axis gross core regions (F) on the masked parts.

The size of the c-axis gross core regions (F) is not restricted. The diameter of the c-axis gross core regions (F) increases as the growing crystal thickness increases.

FIG. 1(a) shows a growing GaN crystal. Core seeds 30 are born on masked part 20 and large c-axis gross core regions (F) 31 are grown from the core seeds 30. Random defect bundle regions (G) 12 are yielded in matrix crystal regions (R) (low dislocation single crystal regions (Z) and C-plane growth regions (Y)) on exposed parts of an undersubstrate 10. Succeeding dislocations on the undersubstrate 10, the random defect bundle regions (G) 12 have converged dislocations as a bundle. Occurrence of the random defect bundle regions (G) 12 diminishes the dislocation density difference between the top parts 11t and the bottom parts 11s. Reduction of the vertical dislocation density difference enables the random defect bundle regions (G) 12 further to reduce distortion of a produced GaN wafer. The random defect bundle regions (G) 12 are grown following random pits which occur at random on surfaces of the low dislocation single crystal regions (Z) and C-plane growth regions (Y). 12g denotes a random pit hysteresis line which penetrates the low dislocation single crystal region (Z) from bottom to top.

A conventional HVPE method preliminary makes an amorphous GaN buffer layer at a low temperature of 400° C. to 600° C. on an undersubstrate for suppressing inheritance of dislocations from the undersubstrate to the growing GaN crystal and grows an epitaxial thick layer on the GaN buffer layer at a high temperature between 900° C. and 1200° C. In the conventional growth, the high temperature converts the amorphous GaN buffer layer into crystal and the crystallized buffer layer forms a part of the grown GaN crystal. The conventional method can be applied to the growing method of the present invention.

The growth method at first produces an amorphous GaN buffer layer on masked parts and exposed parts at a low temperature, heats the specimen up to the epitaxial growth temperature and converts the amorphous GaN buffer layer into single crystals on the exposed parts, whose orientation is determined by the undersubstrate. Matrix crystal regions (R) (=low dislocation single crystal regions (Z) and C-plane growth regions (Y); R=Z+Y) grow on the single crystallized GaN buffer layer on the exposed parts. Parts of the low dislocation single crystal regions (Z) grow in an lateral direction, overrun the exposed parts on the masked parts and become voluminous defect accumulating regions (H) on the masked parts. The amorphous GaN buffer layers on the amorphous GaN masks become polycrystalline core seeds having a variety of a-axes different from the a-axis of the low dislocation single crystal regions (Z) and C-plane growth regions (Y). C-axis core regions (F) grow on the core seeds on the masked parts. The c-axes of the c-axis gross core regions (F) are equal to the c-axis of the low dislocation single crystal regions (Z) and C-plane growth regions (Y).

As shown in FIG. 1(a), the grown GaN crystal is horizontally sliced in a top plane 11t and a bottom plane 11s which are in parallel with the principal surface of the undersubstrate. A flat as-cut GaN wafer having a top surface 11t and a bottom surface 11s is obtained. A mirror wafer is made by polishing the principal (top) plane of the as-cut wafer as denoted by FIG. 1(b).

[Preferable Version 3]

Preferable Version 3 of the present invention produces a GaN substrate by adopting the GaN substrate made by the previous second preferable version as an undersubstrate and growing a gallium nitride crystal on the GaN undersubstrate without mask-formation as denoted by FIG. 2(a).

A starting GaN undersubstrate 1 in FIG. 2(a) inherently has low dislocation single crystal regions (Z), C-plane growth regions (Y) 11, voluminous defect accumulating regions (H) 21, c-axis gross core regions (F) 31 and random defect bundle regions (G) 12. A growing GaN crystal inherits the low dislocation single crystal regions (Z), C-plane growth regions (Y) 11, voluminous defect accumulating regions (H) 21, c-axis gross core regions (F) 31 and random defect bundle regions (G) 12 from the GaN undersubstrate 1. The growing speed $V_{ZY}$ of the low dislocation single crystal regions (Z) and C-plane growth regions (Y) (=matrix crystal regions (R)) 11 is faster than the growing speed $V_H$ of the voluminous defect accumulating regions (H). The growing speed $V_F$ of the c-axis gross core regions (F) 31 is faster than the growing speed $V_H$ of the voluminous defect accumulating regions (H). Namely, $V_{ZY} > V_H$, $V_F > V_H$. The volume (section) of the c-axis gross core regions (F) is increasing, or at least is maintained during the epitaxial growth. The speed difference bears new dislocations at interfaces between the c-axis gross core regions (F) and low dislocation single crystal regions (Z). New generation of dislocations nearly cancels the decrement of dislocations by the function of the voluminous defect accumulating regions (H). Newly-born dislocations alleviate the vertical negative dislocation density gradient. Alleviation of the vertical dislocation gradient reduces distortion of the GaN wafer which is produced by cutting the grown GaN crystal in parallel with the planes 11t and 11s and polishing the as-cut wafer. The random defect bundle regions (G) 12 diminish or perish during the growth. Extinction of the random defect bundle regions (G) reduces dislocations in the low dislocation single crystal regions (Z) and C-plane growth regions (Y) 11. The wafer is appropriate for making semiconductor devices thereon.

DETAILED DESCRIPTION OF THE PREFERRED EMBODIMENTS

The present invention proposes a gallium nitride (GaN) crystal substrate and a method of making the gallium nitride crystal substrate, which are explained more in detail by referring to Embodiments and Comparison Examples. All the following Embodiments and Comparison Examples make use of six definite mask Patterns A, B, C, D, E and F as mask layers formed on undersubstrates. Mask patterns have openings. Formation of the mask patterns makes two different kinds of parts on the undersubstrate. One kind is "masked parts", which are covered with masks. The other kind is "exposed parts", which correspond to openings of the mask layer. The exposed parts are not covered with masks. Partial surfaces of the undersubstrate are exposed via openings at the exposed parts.

FIG. 3 denotes Pattern A. Many small round dot masks 20 of a 2 μm diameter (D=2 μm) are formed on an undersubstrate at corner points of equivalent equilateral triangles repeating lengthwise and crosswise. The equivalent equilateral triangles have a 20 μm side. Dot masks align at a 20 μm pitch (p=20 μm) in the horizontal direction and in 60 degree inclining slanting directions as shown in FIG. 3. Seven nearest neighbors form a regular hexagon. A unit triangle includes 1.57 μm² masked parts and 171.63 μm² exposed parts. The exposed parts are far wider than the masked parts. The exposed parts are 109.26 times as wide as the masked parts in Pattern A.

FIG. 4 denotes Pattern B. Pattern B has a series of larger equilateral triangles of a 300 μm side (P=300 μm) repeating in a horizontal direction and 60 degree slanting directions. The triangle is a unit of repetitions. Larger dot masks 20 of a 100 μm diameter (D=100 μm) are disposed at corner points of the series of larger triangles. The larger dot masks 20 are masked parts. One larger dot (D=100 μm) has a 7854 μm² area. The larger dots of a diameter D and a pitch P have no windows. The larger unit equilateral triangle of a P=300 μm side has an area of 38970 μm². A ratio of masked part in the unit triangle is 0.1008. Extra parts outside of the larger rounds are coated with the same mask layer. These extra parts are exposed parts because of plenty of openings. Many small dot windows of a diameter Ds=2 μm are made on the mask layer. One small window has an area of 3.1416 μM². Small windows are allocated on corner points of another series of smaller equilateral triangles aligning at a pitch Ps=4 μm. An extra part in a unit triangle (38970 μm²) has an 35043 μm². A smaller triangle of a Ps=4 μm side has an area of 6.928 μm². One extra part has an opening ratio of 0.2267 (=1.5708/6.928) and a covering ratio of 0.7733. A 35043 μm² extra part has 2529 smaller dot windows. The extra parts are called exposed parts, although the opening ratio is 0.2267. The ratio of exposed parts (35043 μm²): masked parts (3927 μm²) is 0.8992:0.1008 or 8.921:1 in Pattern B.

Pattern C is exhibited in FIG. 5. Parallel stripe masks 20 of a width W of 50 μm are repeatedly aligned with an interval P of 300 μm. The stripe masks have no windows. This is a striped type mask pattern. An exposed part has another width (P-W) of 250 μm. The lengths of the stripes and exposed parts are equal to the length of the crystal. The ratio of exposed parts: masked parts is 250:50 or 5:1.

Pattern D is exhibited in FIG. 6. Parallel wider stripe masks 20 of a width W of 50 μm are repeatedly aligned with an interval P of 300 μm. The stripe masks have no windows. This is another striped type mask pattern. An extra part between neighboring stripes has another width (P-W) of 250 μm. The extra parts are covered with the same material mask. But the mask has many small windows of a diameter Ds=2 μm aligning horizontally and slantingly at a pitch Ps=4 μm. The lengths of the stripes and extra parts are equal to the length of the crystal. The ratio of exposed parts: masked parts is 250:50 or 5:1. The extra part contains many windows. A tiny round window has an area of 3.1416 μm². A unit triangle has an area of 6.928 μm². An extra part has an opening ratio of 0.2267 (=3.1416/2/6.928). In spite of the small opening ratio, the extra parts are called exposed parts. Crystals start to grow on the exposed parts first.

Pattern E is exhibited in FIG. 5. Parallel stripe masks 20 of a width W of 100 μm are repeatedly aligned with an interval P of 300 μm. The stripe masks have no windows. This is a striped type mask pattern. An exposed part has another width (P-W) of 200 μm. The lengths of the stripes and exposed parts are equal to the length of the crystal. The ratio of exposed parts: masked parts is 200:100 or 2:1.

Pattern F is exhibited in FIG. 6. Parallel wider stripe masks 20 of a width W of 200 μm are repeatedly aligned with an interval P of 500 μm. The stripe masks have no windows. This is another striped type mask pattern. An extra part between neighboring stripes has another width (P-W) of 300 μm. The extra parts are covered with the same material mask. But the mask has many small windows of a diameter Ds=2 μm aligning horizontally and slantingly at a pitch Ps=4 μm. The lengths of the stripes and extra parts are equal to the length of the crystal. The ratio of exposed parts: masked parts is 300:200 or 3:2. The extra part contains many windows. A tiny round window has an area of 3.1416 μm². A unit triangle has an area of 6.928 μm². An extra part has an opening ratio of 0.2267(=3.1416/2/6.928). In spite of the small opening ratio, the extra parts are called exposed parts. Crystals start to grow on the exposed parts first.

Embodiment 1

An undersubstrate is a GaN/sapphire substrate prepared by growing epitaxially a 2 μm thick GaN layer by an MOCVD method on a 5.08 cm wide, 0.4 mm thick sapphire single crystal substrate. Sputtering and etching make a mask Pattern A of a silicon dioxide film ($SiO_2$) on the GaN/sapphire undersubstrate. A GaN crystal is grown on the masked GaN/sapphire undersubstrate by an MOCVD method on a growing condition of a growing temperature of 1030° C., a TMG gas partial pressure of 2.53 Pa, an $NH_3$ gas partial pressure of 5.07 kPa and a growth time of 50 hours.

The MOCVD growth makes a 0.2 mm thick GaN crystal. A 0.15 mm thick GaN wafer is cut from the grown crystal. The GaN wafer is observed by a fluorescence microscope. Existence of low dislocation single crystal regions (Z), C-plane growth regions (Y), voluminous defect accumulating regions (H), c-axis gross core regions (F) and random defect bundle regions (G) is confirmed by the fluorescence microscope observation. The GaN substrate has a 0.3/cm$^2$ density of the c-axis gross core regions (F) with diameters less than 1 mm (d<1 mm) and a 9/cm$^2$ density of the random defect bundle regions (G) with diameters less than 500 μm (d<500 μm). The curvature radius of the GaN wafer surface is 150 cm, which means sufficiently small distortion. The curvature radius is calculated by the result of measurement by a contact pin step height meter. The results are listed on Table 1.

COMPARISON EXAMPLE 1

Another gallium nitride crystal is produced on a condition similar to Embodiment 1 except the partial pressures of the material gases. The TMG partial pressure is 1.01 Pa and the $NH_3$ partial pressure is 2.03 kPa in Comparison example 1. The partial pressures are lower than Embodiment 1 ($P_{TMG}$=2.53 Pa, $P_{NH3}$=5.07 kPa). A 0.2 mm thick GaN crystal is grown. A 0.15 mm thick GaN wafer is produced. The GaN wafer has low dislocation single crystal regions (Z), C-plane growth regions (Y) and voluminous defect accumulating regions (H). But the GaN wafer has neither c-axis gross core regions (F) nor random defect bundle regions (G). Distortion is large. The curvature radius is 50 cm in Comparison Example 1.

Embodiment 2

An undersubstrate is a sapphire single crystal substrate of a 5.08 cm diameter and a 0.4 mm thickness. A mask Pattern B (FIG. 4) of a silicon dioxide ($SiO_2$) film is made on the sapphire undersubstrate by sputtering and etching. A GaN crystal is grown on the masked sapphire undersubstrate by an HVPE method on a growing condition of a growing temperature of 1050° C., a GaCl gas partial pressure of 3.04 kPa, an $NH_3$ gas partial pressure of 35.5 kPa and a growth time of 20 hours.

The HVPE growth makes a 2.4 mm thick GaN crystal. A 0.45 mm thick GaN wafer is cut from the grown crystal. The GaN wafer is observed by a fluorescence microscope. Existence of low dislocation single crystal regions (Z), C-plane growth regions (Y), voluminous defect accumulating regions (H), c-axis gross core regions (F) and random defect bundle regions (G) is confirmed by the fluorescence microscope observation. The GaN substrate of Embodiment 2 has a 0.5/cm$^2$ density of the c-axis gross core regions (F) with diameters less than 1 mm (d<1 mm) and a 63/cm$^2$ density of the random defect bundle regions (G) with diameters smaller than 500 μm (d<500 μm). The distortion is extremely small. The curvature radius of the surface is 1480 cm. The results are shown in Table 1.

COMPARISON EXAMPLE 2

Another gallium nitride crystal is produced on a condition similar to Embodiment 2 except the partial pressures of the material gases. The GaCl partial pressure is 1.52 kPa and the $NH_3$ partial pressure is 20.3 kPa in Comparison example 2. GaCl and $NH_3$ partial pressures are lower than Embodiment 2 ($P_{GaCl}$=3.04 kPa, $P_{NH3}$=35.5 kPa). A 1.3 mm thick GaN crystal is grown. A 0.45 mm thick GaN wafer is produced. The GaN wafer has low dislocation single crystal regions (Z), C-plane growth regions (Y) and voluminous defect accumulating regions (H). But the GaN wafer has neither c-axis gross core regions (F) nor random defect bundle regions (G). Distortion is large. The curvature radius is 95 cm in Comparison Example 2. The results are shown in Table 1.

Embodiment 3

Embodiment 3 GaN crystals are produced by a HVPE method on a condition similar to Embodiment 2 except the mask pattern. Embodiment 3 employs another mask of Pattern C (Stripe mask) as shown in FIG. 5 instead of Pattern B (FIG. 4) of Embodiment 2. The HVPE growth produces a 2.4 mm thick GaN crystal. A 0.45 mm thick GaN substrate is obtained by cutting the as-grown GaN crystal. Embodiment 3 GaN wafer includes low dislocation single crystal regions (Z), C-plane growth regions (Y), voluminous defect accumulating regions (H), c-axis gross core regions (F) and random defect bundle regions (G). The density of c-axis gross core regions (F) with diameters less than 1 mm (d<1 mm) is 1.8/cm$^2$ in Embodiment 3. The density of random defect bundle regions (G) with diameters less than 500 μm (d<500 μm) is 22/cm$^2$ in Embodiment 3. The curvature radius of the GaN wafer is 530 cm, which corresponds to small distortion. Table 1 denotes the results of Embodiment 3.

COMPARISON EXAMPLE 3

Comparison example 3 GaN crystals are produced by a HVPE method on a condition similar to Embodiment 3 except the partial pressures of material gases. The partial pressure of GaCl is 1.52 kPa and the partial pressure of $NH_3$ is 20.3 kPa which are lower than Embodiment 3 ($P_{GaCl}$=3.04 kPa, $P_{NH3}$=35.5 kPa). The HVPE growth produces a 1.3 mm thick GaN crystal as Comparison Example 3. A 0.45 mm thick GaN substrate is obtained by cutting the as-grown GaN crystal. Comparison Example 3 GaN wafer includes low dislocation single crystal regions (Z), C-plane growth regions (Y), voluminous defect accumulating regions (H) and c-axis gross core regions (F). But no random defect bundle regions (G) is observed on Comparison Example 3. The density of c-axis gross core regions (F) with diameters less than 1 mm (d<1 mm) is 0.05/cm$^2$ in Comparison Example 3 which is smaller than Embodiment 3. The curvature radius of Comparison Example 3 is 80 cm, which corresponds to big distortion. Table 1 denotes the results of Comparison Examples 3.

Embodiments 4, 5 and 6

Embodiments 4, 5 and 6 GaN crystals are produced by a HVPE method on a condition similar to Embodiment 2 except the mask patterns. Instead of Pattern B of Embodiment 2 and Pattern C of Embodiments 3, Embodiments 4, 5 and 6 employ different pattern masks as shown on Table 1. Embodiment 4 employs Pattern D of $SiO_2$. Embodiment 5 prepares Pattern E of $SiO_2$. Embodiment 6 makes Pattern F of $SiO_2$. The HVPE growth produces 2.4 mm thick GaN crystals for Embodiments 4, 5 and 6. 0.45 mm thick GaN substrates are obtained by cutting the as-grown GaN crystals. GaN wafers of Embodiments 4, 5 and 6 include low dislocation single crystal regions (Z), C-plane growth regions (Y), voluminous defect accumulating regions (H), c-axis gross core regions (F) and random defect bundle regions (G).

Embodiment 4 has a $1.7/cm^2$ c-axis core (under 1 mm diameter: d<1 mm) region (F) density, a $43/cm^2$ random defect (under 500 μm diameter: d<500 μm) bundle regions (G) density and small distortion of a 780 cm curvature radius.

Embodiment 5 has a $3.5/cm^2$ c-axis core (under 1 mm diameter: d<1 mm) region (F) density, a $22/cm^2$ random defect (under 500 μm diameter: d<500 μm) bundle regions (G) density and small distortion of a 840 cm curvature radius.

Embodiment 6 has a $8.0/cm^2$ c-axis core (under 1 mm diameter: d<1 mm) region (F) density, a $42/cm^2$ random defect (under 500 μm diameter: d<500 μm) bundle regions (G) density and very small distortion of a 1800 cm curvature radius. Table 1 denotes the results of Embodiments 4, 5 and 6.

Embodiment 7

Embodiment 7 GaN crystals are produced by a HVPE method on a condition similar to Embodiment 2 except the material and pattern of masks. Instead of the $SiO_2$-made Pattern B mask of Embodiment 2, Embodiment 7 employs an $Si_3N_4$-made Pattern C mask. The HVPE growth produces 2.4 mm thick GaN crystals for Embodiment 7. A 0.45 mm thick GaN wafer is obtained by cutting the as-grown GaN crystal. The GaN wafer of Embodiment 7 includes low dislocation single crystal regions (Z), C-plane growth regions (Y), voluminous defect accumulating regions (H), c-axis core (under 1 mm diameter: d<1 mm) regions (F) and random defect (under 500 μm diameter: d<500 μm) bundle regions (G).

Embodiment 7 has a $1.7/cm^2$ c-axis core (under 1 mm diameter) region (F) density, a $20/cm^2$ random defect (under 500 μm diameter: d<500 μm) bundle regions (G) density and small distortion of a 450 cm curvature radius.

Table 1

Respective comparisons of Embodiments 1, 2 and 3 with Comparison Examples 1, 2 and 3 in Table 1 teach us that embodiment GaN crystal substrates, which are grown on an undersubstrate coated with window-carrying masks by making seed cores on the masked parts, growing low dislocation single crystal regions (Z) and C-plane growth regions (Y) on exposed parts and forming c-axis gross core regions (F) on the seed cores, include a $0.1/cm^2$ to $10/cm^2$ ($0.1/cm^2 \leq D \leq 10/cm^2$) density of c-axis gross core regions (F) which contain at least one crystal and have small distortion (large curvature radius).

Comparison of Embodiment 1 with Embodiment 2, comparison of Embodiment 3 with Embodiment 4 and comparison of Embodiment 5 with Embodiment 6 clarify that Pattern B is more effective than Pattern A, Pattern D is more effective than Pattern C and Pattern F is more effective than Pattern E in making small distortion GaN wafers with longer curvature radii. Patterns A, C and E consist of covering parts and exposing parts. Patterns B, D and F consist of covering parts and quasi-exposed parts having films with small windows. The quasi-exposed parts contain covering films and tiny windows. The windowed-film exposed parts (Patterns B, D and F) would be preferable to blunt naked parts (Patterns A, C and E) for allowing core seeds to happen on the solid covering parts.

Comparison of Embodiment 3 with Embodiment 7 teaches us that both the $SiO_2$ mask and $Si_3N_4$ mask are favorable for making small distortion GaN wafers with large curvature radii.

Embodiment 8

Embodiment 8 employs a sapphire single crystal wafer of a 5.08 cm diameter and a 0.4 mm thickness as an undersubstrate. An $Si_3N_4$ mask Pattern C is formed on the sapphire undersubstrate by sputtering. Another $SiO_2$ mask Pattern B is superposed on the $Si_3N_4$-masked sapphire undersubstrate as a mask layer. A GaN buffer layer is formed on the $SiO_2/Si_3N_4$ masked sapphire undersubstrate by an HVPE method. The GaN buffer layer is produced by supplying the undersubstrate heated at 490° C. with a 0.203 kPa partial pressure of GaCl gas and a 20.3 kPa partial pressure of $NH_3$ gas. The growth time is 0.25 hour (15 minutes). The GaN buffer layer is crystallized by heating the sample up to 1050° C. and supplying the buffer/undersubstrate with a 3.04 kPa partial pressure of GaCl gas and a 35.5 kPa partial pressure of $NH_3$ gas. Then an epitaxial GaN layer is grown upon the GaN buffer layer on the same condition of 1050° C. at the 3.04 kPa GaCl partial pressure and the 35.5 kPa $NH_3$ partial pressure for 20 hours.

The HVPE epitaxial growth makes a 2.4 mm thick GaN crystal. A 0.45 mm thick GaN wafer of Embodiment 8 is obtained by slicing the 2.4 mm high grown crystal. The Embodiment 8 GaN wafer has low dislocation single crystal regions (Z), C-plane growth regions (Y), voluminous defect accumulating regions (H), c-axis gross core regions (F) and random defect bundle regions (G). Embodiment 8 has a $2.3/cm^2$ density of the c-axis gross core regions (F) with diameters less than 1 mm (d<1 mm) and a $25/cm^2$ density of the random defect bundle regions (G) with diameters smaller than 500 μm (d<500 μm). The curvature radius of the Embodiment 8 GaN wafer is 700 cm, which means sufficiently small distortion. The results of Embodiment 8 are listed on Table 2.

Embodiments 9, 10, 11, 12 and 13

Embodiments 9, 10, 11, 12 and 13 make GaN crystals on undersubstrates and mask patterns shown on Table 2. The conditions are described on Table 2.

Embodiment 9 produces a 2.4 mm thick GaN crystal. A 0.45 mm thick GaN wafer is obtained by cutting. The GaN wafer of Embodiment 9 includes low dislocation single crystal regions (Z), C-plane growth regions (Y), voluminous defect accumulating regions (H), c-axis gross core regions (F) and random defect bundle regions (G). Embodiment 9 has a $2.5/cm^2$ density of c-axis core (d<1 mm) regions (F) and a $27/cm^2$ density of random defect (d<0.5 mm) bundle regions (G). The curvature radius of Embodiment 9 is 750 cm, which means small distortion.

Embodiment 10 produces a 2.4 mm thick GaN crystal. A 0.45 mm thick GaN wafer is obtained by cutting. The GaN wafer of Embodiment 10 includes low dislocation single crystal regions (Z), C-plane growth regions (Y), voluminous defect accumulating regions (H), c-axis gross core regions (F) and random defect bundle regions (G). Embodiment 10 has a $2.5/cm^2$ density of c-axis core (d<1 mm) regions (F) and a $25/cm^2$ density of random defect (d<0.5 mm) bundle regions (G). The curvature radius of Embodiment 9 is 770 cm, which means small distortion.

Embodiment 11 produces a 2.6 mm thick GaN crystal. A 0.45 mm thick GaN wafer is obtained by cutting. The GaN wafer of Embodiment 11 includes low dislocation single crystal regions (Z), C-plane growth regions (Y), voluminous defect accumulating regions (H), c-axis gross core regions (F) and random defect bundle regions (G). Embodiment 11 has a 3.4/cm$^2$ density of c-axis core (d<1 mm) regions (F) and a 24/cm$^2$ density of random defect (d<0.5 mm) bundle regions (G). The curvature radius of Embodiment 11 is 830 cm, which means small distortion.

Embodiment 12 produces a 2.9 mm thick GaN crystal. A 0.45 mm thick GaN wafer is obtained by cutting. The GaN wafer of Embodiment 12 includes low dislocation single crystal regions (Z), C-plane growth regions (Y), voluminous defect accumulating regions (H), c-axis gross core regions (F) and random defect bundle regions (G). Embodiment 12 has a 3.1/cm$^2$ density of c-axis core (d<1 mm) regions (F) and a 25/cm$^2$ density of random defect (d<0.5 mm) bundle regions (G). The curvature radius of Embodiment 12 is 780 cm, which means small distortion.

Embodiment 13 produces a 2.4 mm thick GaN crystal. A 0.45 mm thick GaN wafer is obtained by cutting. The GaN wafer of Embodiment 13 includes low dislocation single crystal regions (Z), C-plane growth regions (Y), voluminous defect accumulating regions (H), c-axis gross core regions (F) and random defect bundle regions (G). Embodiment 13 has a 2.6/cm$^2$ density of c-axis core (d<1 mm) regions (F) and a 27/cm$^2$ density of random defect (d<0.5 mm) bundle regions (G). The curvature radius of Embodiment 13 is 780 cm, which means small distortion. The results of Embodiment 9, 10, 11, 12 and 13 are listed on Table 2.

Table 2

Comparison of Embodiment 7 on Table 1 with Embodiments 8 and 9 on Table 2 indicates that the preliminary formation of the GaN buffer layer on an undersubstrate has a tendency of enlarging curvature radii, which is equivalent to reducing distortion of GaN wafers.

Comparison of Embodiment 9 with Embodiment 10 on Table 2 suggests that both a set of a sapphire undersubstrate and an Si$_3$N$_4$ mask and another set of a GaAs undersubstrate and an SiO$_2$ mask succeed in enlarging curvature radii, which is equivalent to reducing distortion of GaN wafers.

Comparison of Embodiment 10 with Embodiments 11 and 12 on Table 2 denotes that an oversaturated GaN gas atmosphere built by supplying excess partial pressures of Ga-material gas and N-material gas during crystal growth is effective in enlarging curvature radii, equivalent to reducing distortion of GaN wafers. The Inventors suppose that oversaturation of GaN gas shall facilitate the occurrence of core seeds on masks and the growth of the core seeds into large c-axis gross core regions (F) on the masks.

Comparison of Embodiment 10 with Embodiment 13 on Table 2 indicates that an enlargement of undersubstrate sizes from a 5.08 cm (2-inch) diameter to 10.16 cm (4-inch) diameter is not unfavorable to enlarging curvature radii, which is equivalent to reducing distortion of GaN wafers.

Embodiments 14, 15 and 16 and Comparison Example 4

Similarly to Embodiment 12, Embodiments 14, 15 and 16 and Comparison Example 4 produce Pattern C SiO$_2$ films on 5.08 cm (2-inch) diameter GaAs wafers, form GaN buffer layers on the masked GaAs undersubstrates, grow GaN epitaxial layers under an oversaturated GaN gas atmosphere by supplying growing GaN crystals with more than 2.5 kPa partial pressure of Ga-material gas and more than 30 kPa partial pressure of N-material gas for a definite interval from the beginning of the GaN crystal growth.

Comparison Example 4 epitaxially grows a GaN crystal for early 0.017 hour (1 minute) from the beginning on a condition of a 3.04 kPa GaCl (Ga-material gas) partial pressure and a 35.5 kPa NH$_3$ (N-material gas) partial pressure, which is called a saturated condition A hereafter, and for following 19.983 hours on another condition of a 1.52 kPa GaCl partial pressure and a 20.3 kPa NH$_3$ partial pressure, which is called an unsaturated condition B hereafter. Namely, Comparison Example 4 is made on 0.017 hour saturated condition A and 19.983 hour unsaturated condition B. 20 hour growth makes a 1.3 mm thick GaN crystal of Comparison Example 4. A 0.45 mm thick GaN wafer is obtained by cutting the grown GaN crystal. The GaN wafer of Comparison Example 4 has low dislocation single crystal regions (Z), C-plane growth regions (Y) and voluminous defect accumulating regions (H). But neither c-axis gross core regions (F) nor random defect bundle regions (G) appear in Comparison Example 4. Comparison Example 4 has large distortion. The curvature radius of Comparison Example 4 is 95 cm, which means large distortion. Table 3 shows the results of Comparison Example 4.

Embodiment 14 epitaxially grows a GaN crystal for early 0.05 hour (3 minutes) from the beginning under the saturated condition A ($P_{GaCl}$=3.04 kPa, $P_{NH3}$=35.5 kPa) and for following 19.95 hours under the unsaturated condition B ($P_{GaCl}$=1.52 kPa, $P_{NH3}$=20.3 kPa). Other conditions are similar to Comparison Example 4. 20 hour growth produces a 1.3 mm thick GaN crystal. A 0.45 mm thick GaN wafer of Embodiment 14 is obtained by cutting the grown crystal. Embodiment 14 has low dislocation single crystal regions (Z), C-plane growth regions (Y), voluminous defect accumulating regions (H), c-axis core (d<1 mm) regions (F) and random defect (d<0.5 mm) bundle regions (G). Embodiment 14 has a 0.3/cm$^2$ density of c-axis gross core regions (F) and a 1/cm$^2$ density of random defect bundle regions (G). The curvature radius of the surface is 170 cm, which means small distortion. Table 3 denotes the results of Embodiment 14.

Embodiment 15 epitaxially grows a GaN crystal for early 0.17 hour (10 minutes) from the beginning under the saturated condition A ($P_{GaCl}$=3.04 kPa, $P_{NH3}$=35.5 kPa) and for following 19.83 hours under the unsaturated condition B ($P_{GaCl}$=1.52 kPa, $P_{NH3}$=20.3 kPa). Other conditions are similar to Comparison Example 4. 20 hour growth produces a 1.3 mm thick GaN crystal. A 0.45 mm thick GaN wafer of Embodiment 15 is obtained by cutting the grown crystal. Embodiment 15 has low dislocation single crystal regions (Z), C-plane growth regions (Y), voluminous defect accumulating regions (H), c-axis core (d<1 mm) regions (F) and random defect (d<0.5 mm) bundle regions (G). Embodiment 15 has a 1.5/cm$^2$ density of c-axis gross core regions (F) and a 2/cm$^2$ density of random defect bundle regions (G). The curvature radius of the surface is 320 cm, which means small distortion. Table 3 denotes the results of Embodiment 15.

Embodiment 16 epitaxially grows a GaN crystal for early 1 hour (60 minutes) from the beginning under the saturated condition A ($P_{GaCl}$=3.04 kPa, $P_{NH3}$=35.5 kPa) and for following 19 hours under the unsaturated condition B ($P_{GaCl}$=1.52 kPa, $P_{NH3}$=20.3 kPa). Other conditions are similar to Comparison Example 4. 20 hour growth produces a 1.3 mm thick GaN crystal. A 0.45 mm thick GaN wafer of Embodiment 16 is obtained by cutting the grown crystal. Embodiment 16 has low dislocation single crystal regions (Z), C-plane growth regions (Y), voluminous defect accumulating regions (H), c-axis gross core (d<1 mm) regions (F) and random defect (d<0.5 mm) bundle regions (G). Embodiment 16 has a 2.5/cm$^2$ density of c-axis gross core regions (F) and a 2/cm$^2$ density of random defect bundle regions (G). The curvature radius of the surface is 710 cm, which means small distortion. Table 3 denotes the results of Embodiment 16.

Table 3

Comparison of Comparison Example 4 on Table 3 with Embodiments 14, 15 and 16 teaches us that at least 3 minutes of saturated GaN gas condition growth at an early stage of growth makes $0.1/cm^2$ to $10/cm^2$ of c-axis gross core regions (F). The saturated GaN gas condition means more than 2.5 kPa of a Ga-material gas partial pressure and more than 30 kPa of a N-material gas partial pressure.

Saturated GaN gas condition=$P_{GaCl}$>2.5 kPa,
$P_{NH3}$>30 kPa (in case of HVPE)

Unsaturated GaN gas condition=$P_{GaCl}$≦2.5 kPa,
$P_{NH3}$≦30 kPa (in case of HVPE)

The above saturated condition A ($P_{GaCl}$=3.04 kPa, $P_{NH3}$=35.5 kPa) is one of the saturated GaN gas conditions. The above unsaturated condition B ($P_{GaCl}$=1.52 kPa, $P_{NH3}$=20.3 kPa) is one of the unsaturated GaN gas conditions. Embodiments 14, 15 and 16 prove that an increment of the time of the saturated condition growth increases the c-axis gross core regions (F) (d<1 mm) density.

Embodiment 17

Embodiment 17 grows a GaN crystal by forming $SiO_2$ mask Pattern C on a GaAs undersubstrate, depositing a GaN buffer layer at 490° C. and growing an epitaxial GaN layer at 1050° C. for 50 hours with supplies of a 3.04 kPa partial pressure of GaCl gas and a 40.5 kPa partial pressure of $NH_3$ gas. Growing conditions are listed on Table 4. 50 hour growth produces a 5.8 mm thick GaN crystal. Three GaN wafers of a 0.45 mm thickness are produced by slicing the grown GaN crystal. All the three GaN wafers have C-plane growth regions (Y), low dislocation single crystal regions (Z), c-axis gross core regions (F) and random defect bundle regions (G). Three GaN wafers made by Embodiment 17 are named as Embodiments 17-I (bottom, undersubstrate), 17-II (middle) and 17-III (top) in an order of the growth direction.

Embodiment 17-I indicates a $3.3/cm^2$ density of c-axis gross core regions (F) (d<1 mm), a $22/cm^2$ density of random defect (d<0.5 mm) bundle regions (G) and small distortion of a 770 cm curvature radius.

Embodiment 17-II indicates a $3.3/cm^2$ density of c-axis gross core regions (F) (d<1 mm), a $2/cm^2$ density of random defect (d<0.5 mm) bundle regions (G) and small distortion of a 750 cm curvature radius.

Embodiment 17-III indicates a $3/cm^2$ density of c-axis gross core regions (F) (d<1 mm), a $0.3/cm^2$ density of c-axis gross core regions (F) (1 mm≦d<2 mm), a $0/cm^2$ density of random defect (d<0.5 mm) bundle regions (G) and small distortion of a 750 cm curvature radius. Table 4 shows the results.

Embodiment 18

Embodiment 18 employs Embodiment 17-I's GaN wafer as an undersubstrate. Without a mask and a buffer layer, Embodiment 18 grows an epitaxial GaN layer at 1050° C. for 50 hours with supplies of a 3.04 kPa partial pressure of GaCl gas and a 35.5 kPa partial pressure of $NH_3$ gas. Growing conditions are listed on Table 4. 50 hour growth produces a 5.8 mm thick GaN crystal. Three GaN wafers of a 0.45 mm thickness made by Embodiment 18 are named as Embodiments 18-I (bottom, undersubstrate), 18-II (middle) and 18-III (top) in order of the growth direction.

Embodiment 18-I indicates a $3.3/cm^2$ density of c-axis gross core regions (F) (d<1 mm), a $0.1/cm^2$ density of random defect (d<0.5 mm) bundle regions (G) and small distortion of a 740 cm curvature radius.

Embodiment 18-II indicates a $3/cm^2$ density of c-axis gross core regions (F) (d<1 mm), a $0.2/cm^2$ density of c-axis gross core regions (F) (1 mm≦d<2 mm), a $0/cm^2$ density of random defect (d<0.5 mm) bundle regions (G) and small distortion of a 730 cm curvature radius. Table 4 shows the results.

Embodiment 19

Embodiment 19 employs Embodiment 17-II's GaN wafer as an undersubstrate. Without a mask and a buffer layer, Embodiment 19 grows an epitaxial GaN layer at 1050° C. for 50 hours with supplies of a 3.04 kPa partial pressure of GaCl gas and a 35.5 kPa partial pressure of $NH_3$ gas. Growing conditions are listed on Table 4. 50 hour growth produces a 5.8 mm thick GaN crystal. Three GaN wafers of a 0.45 mm thickness made by Embodiment 19 are named as Embodiments 19-I (bottom, undersubstrate), 19-II (middle) and 19-III (top) in order of the growth direction.

Embodiment 19-I indicates $3/cm^2$ of c-axis gross core regions (F) (d<1 mm), $0.2/cm^2$ of c-axis gross core regions (F) (1 mm≦d<2 mm), $0/cm^2$ of random defect (d<0.5 mm) bundle regions (G) and small distortion of a 750 cm curvature radius.

Embodiment 19-II indicates $2.8/cm^2$ of c-axis gross core regions (F) (d<1 mm), $0.4/cm^2$ of c-axis gross core regions (F) (1 mm≦d<2 mm), $0/cm^2$ of random defect (d<0.5 mm) bundle regions (G) and small distortion of a 740 cm curvature radius. Table 4 shows the results.

Table 4

Embodiment 17 on Table 4 succeeds in making a plurality of GaN wafers by growing a thick GaN crystal for a long time and slicing the thick GaN crystal into several wafers. All the wafers have small distortion, which is equivalent to long curvature radii. An increment of the thickness of GaN crystals widens the c-axis gross core regions (F) and lowers the random defect bundle region (G) density.

Embodiments 18 and 19 on Table 4 succeed in making further low-distortion GaN wafers having further c-axis gross core regions (F) by employing Embodiment 17-I and 17-II wafers, respectively as undersubstrates.

In Embodiments 18 and 19, new c-axis gross core regions (F) are successively produced on the c-axis gross core regions (F) of Embodiment 17-I and 17-II wafers. Large c-axis gross core regions (F), whose diameter is bigger than 1 mm, sometimes appear in Embodiments 18 and 19. On the contrary Embodiments 18 and 19 do not succeed the random defect bundle regions (G) existing on Embodiment 17-I and 17-II undersubstrates. Thus c-axis gross core regions (F) are transferred from an undersubstrate to an epitaxial layer. The random defect bundle regions (G) are not transferred from an undersubstrate to an epitaxial layer.

All the embodiments disclosed are explanatory and not restrictive. The scope of protection of the present invention shall be determined by the description of claims and shall include equivalents of the claimed inventions.

BRIEF DESCRIPTION OF THE DRAWINGS

FIG. 1(*b*) is a gallium nitride substrate by cutting the FIG. 1(*a*) grown gallium nitride crystal along lines 11*a*-11*b*.

Figure 1:
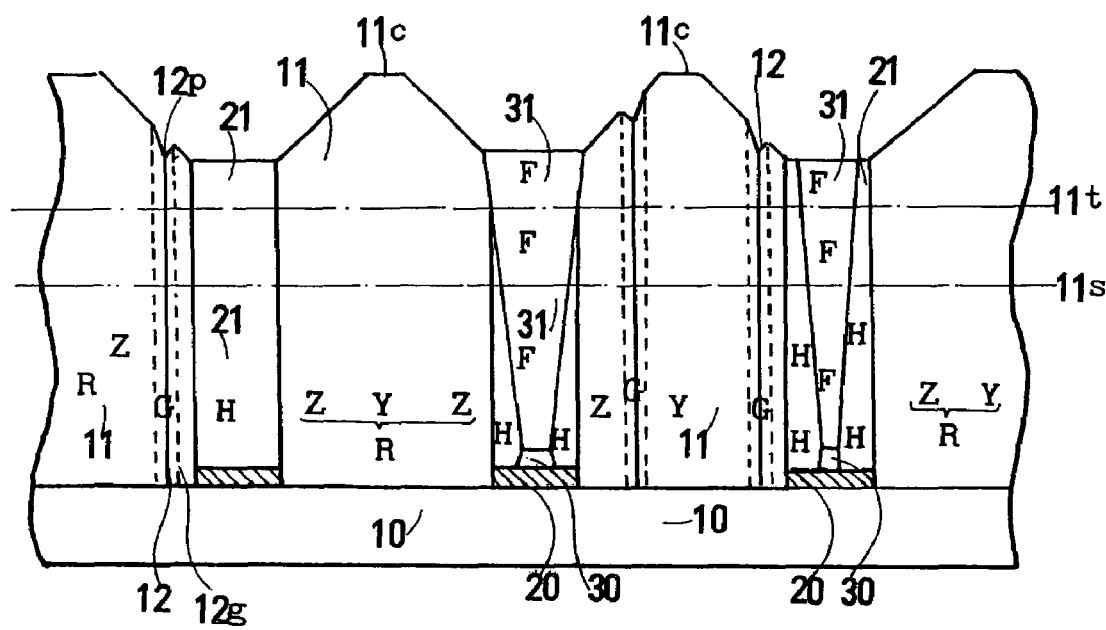
FIG. 1(*a*) is a schematic sectional view of a growing gallium nitride crystal as an embodiment of the present invention.
Figure 1:
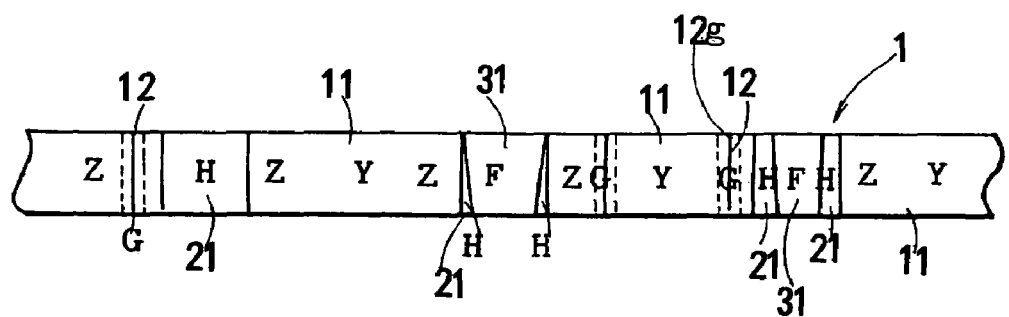
Figure 2:
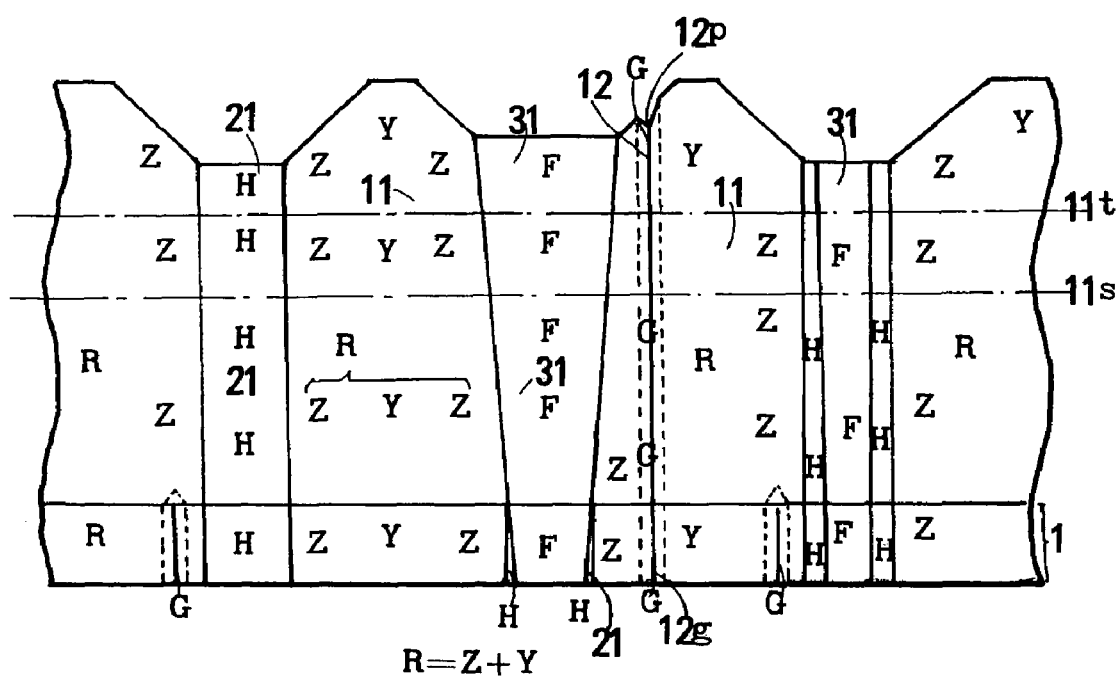
FIG. 2(a) is another sectional view of a growing gallium nitride crystal as another embodiment of the present invention.
FIG. 2(b) is a gallium nitride substrate by cutting the FIG. 2(a) grown gallium nitride crystal along lines 11a-11b.
Figure 2:
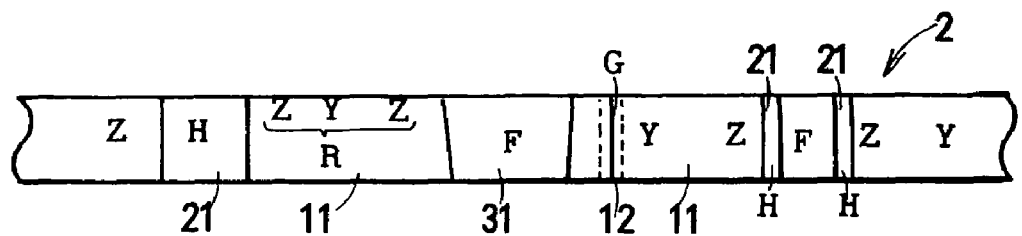
Figure 3:
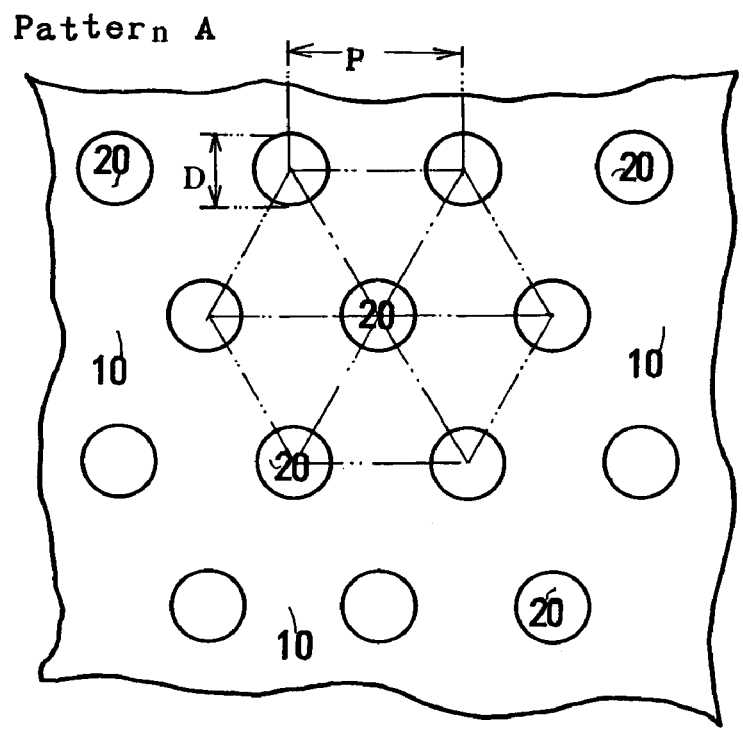
FIG. 3 is a plan view of a mask Pattern A for mask films.
Figure 4:
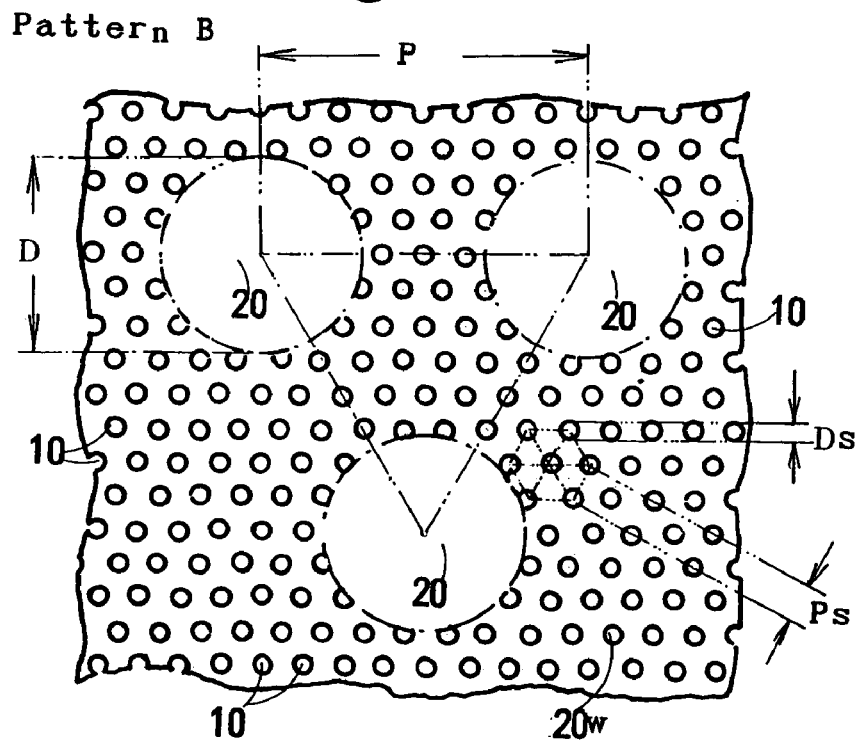
FIG. 4 is a plan view of another mask Pattern B for mask films.
Figure 5:
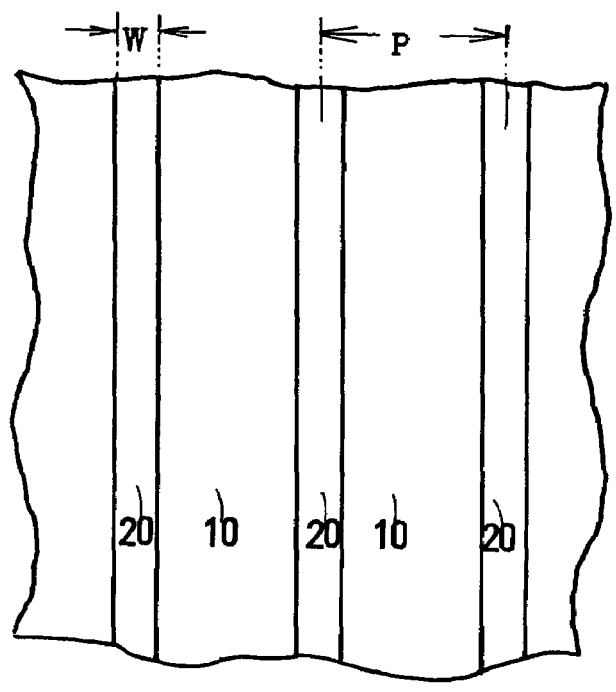
FIG. 5 is a plan view of another mask Pattern C or Pattern E for mask films.
Figure 6:
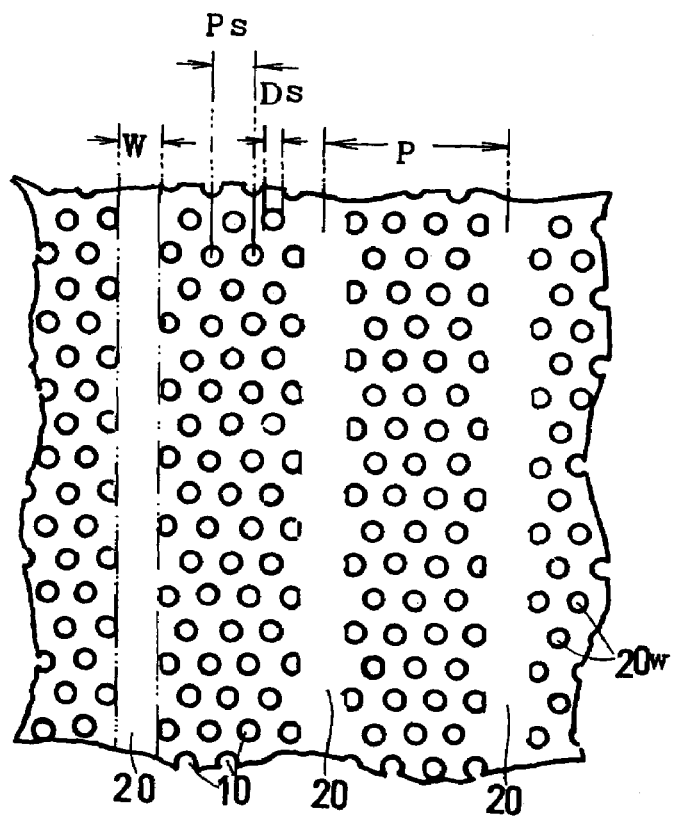
FIG. 6 is a plan view of another mask Pattern D or Pattern F for mask films.
Figure 7:
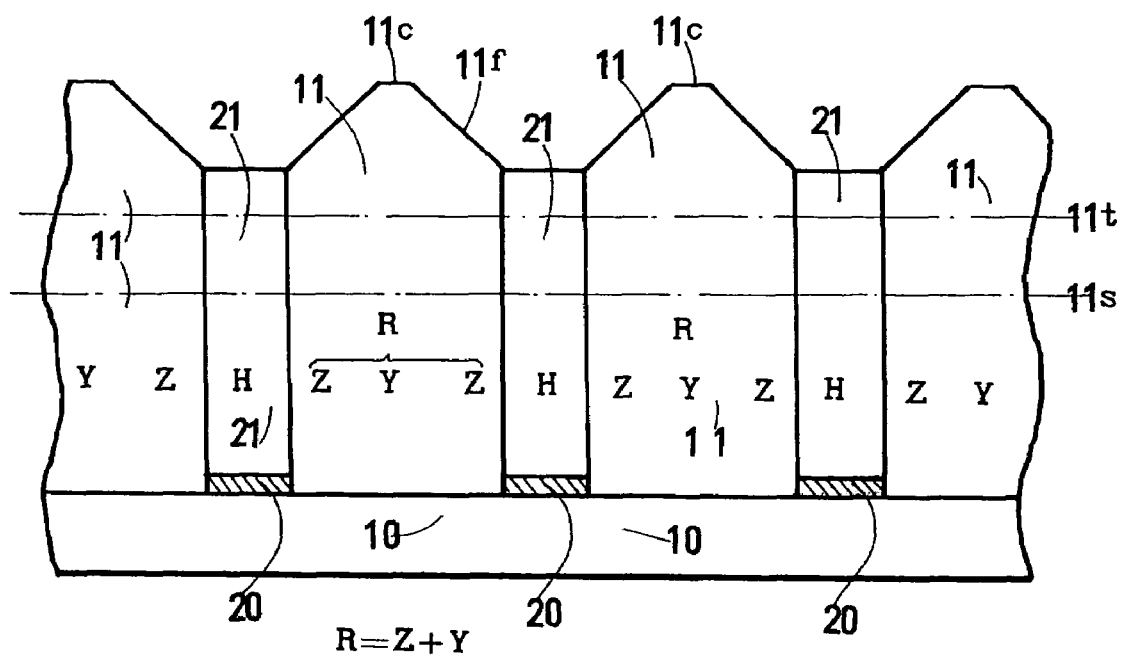
FIG. 7(a) is a sectional view of a gallium nitride crystal grown by a prior facet growth method.
FIG. 7(b) is a gallium nitride substrate by cutting the FIG. 7(a) grown gallium nitride crystal along lines 11a-11b.
Figure 7:
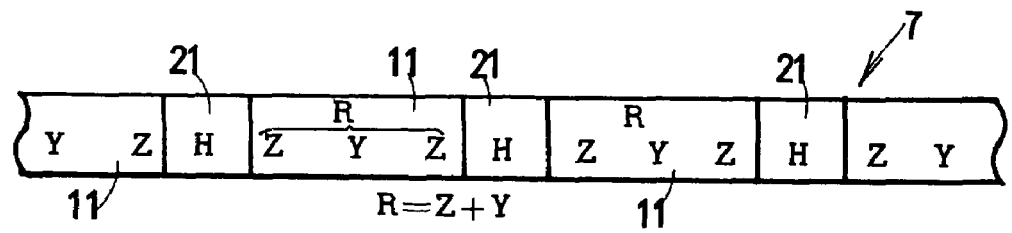

We claim:

1. A gallium nitride crystal substrate comprising;
    low dislocation single crystal regions (Z) having a definite c-axis and a definite a-axis,
    C-plane growth regions (Y) having a c-axis and an a-axis parallel to the c-axis and the a-axis of the low dislocation single crystal regions (Z),
    voluminous defect accumulating regions (H) having a c-axis inverse to the c-axis of the low dislocation single crystal regions (Z) and an a-axis parallel with the a-axis of the low dislocation single crystal regions (Z), and
    $0.1/cm^2$ to $10/cm^2$ c-axis gross core regions (F) containing at least one crystal having a c-axis parallel to the c-axis of the low dislocation single crystal regions (Z) and an a-axis different from the a-axis of the low dislocation single crystal regions (Z).

2. The gallium nitride crystal substrate as claimed in claim 1, wherein the low dislocation single crystal regions (Z) and C-plane growth regions (Y) contain $0/cm^2$ to $100/cm^2$ random defect bundle regions (G).

3. A method of producing a gallium nitride crystal substrate which includes
    low dislocation single crystal regions (Z) having a definite c-axis and a definite a-axis,
    C-plane growth regions (Y) having a c-axis and an a-axis parallel to the c-axis and the a-axis of the low dislocation single crystal regions (Z),
    voluminous defect accumulating regions (H) having a c-axis inverse to the c-axis of the low dislocation single crystal regions (Z) and an a-axis of the low dislocation single crystal regions (Z), and $0.1/cm^2$ to $10/cm^2$ c-axis gross core regions (F) containing at least one crystal having a c-axis parallel to the c-axis of the low dislocation single crystal regions (Z) and an a-axis different from the a-axis of the low dislocation single crystal regions (Z),
    comprising the steps of,
    preparing an undersubstrate of single crystal,
    forming masks having openings on the undersubstrate,
    making masked parts and exposed parts on the undersubstrate,
    supplying the masked undersubstrate with a Ga-material gas and an N-material gas on a GaN gas oversaturation condition at least at an early stage of growth,
    growing a gallium nitride crystal in vapor phase on the masked undersubstrate,
    growing the low dislocation single crystal regions (Z) and C-plane growth regions (Y) on the exposed parts,
    producing at least one core seed on the masked parts,
    making voluminous defect accumulating regions (H) on the masked parts,
    growing c-axis gross core regions (F) from the core seeds on the masked parts,
    supplying the gallium nitride crystal with the Ga-material gas and the N-material gas on a GaN gas oversaturation condition or on a GaN gas unsaturation condition during following growth,
    producing a gallium nitride crystal of a sufficient thickness on the undersubstrate, and
    slicing the gallium nitride crystal into at lease one gallium nitride crystal substrate wafer.

4. A method of producing a gallium nitride crystal substrate comprising the steps of;
    preparing a gallium nitride undersubstrate which includes low dislocation single crystal regions (Z) having a definite c-axis and a definite a-axis,
    C-plane growth regions (Y) having a c-axis and an a-axis parallel to the c-axis and the a-axis of the low dislocation single crystal regions (Z),
    voluminous defect accumulating regions (H) having a c-axis inverse to the c-axis of the low dislocation single crystal regions (Z) and an a-axis of the low dislocation single crystal regions (Z), and
    $0.1/cm^2$ to $10/cm^2$ c-axis gross core regions (F) containing at least one crystal having a c-axis parallel to the c-axis of the low dislocation single crystal regions (Z) and an a-axis different from the a-axis of the low dislocation single crystal regions (Z),
    supplying the masked undersubstrate with a Ga-material gas and an N-material gas on a GaN gas oversaturation condition at least at an early stage of growth,
    growing a gallium nitride crystal in vapor phase on the masked undersubstrate,
    growing low dislocation single crystal regions (Z) and C-plane growth regions (Y) on the low dislocation single crystal regions (Z) and C-plane growth regions (Y) of the gallium nitride undersubstrate,
    producing c-axis gross core regions (F) on the c-axis gross core regions (F) of the gallium nitride undersubstrate,
    making voluminous defect accumulating regions (H) on the voluminous defect accumulating regions (H) of the gallium nitride undersubstrate,
    supplying the gallium nitride crystal with the Ga-material gas and the N-material gas on a GaN gas oversaturation condition or on a GaN gas unsaturation condition during following growth,
    producing a gallium nitride crystal of a sufficient thickness on the gallium nitride undersubstrate,
    slicing the gallium nitride crystal into at least one gallium nitride crystal substrate wafer.

5. The method as claimed in claim 3, wherein more than 2.5 kPa partial pressure of the Ga-material gas and more than 30 kPa partial pressure of the N-material gas are supplied to the masked undersubstrate for at least three minutes from the beginning of growth in an HVPE method.

6. The method as claimed in claim 4, wherein more than 2.5 kPa partial pressure of the Ga-material gas and more than 30 kPa partial pressure of the N-material gas are supplied to the masked undersubstrate for at least three minutes from the beginning of growth in an HVPE method.

* * * * *